US009093175B2

(12) United States Patent
Barth, Jr. et al.

(10) Patent No.: US 9,093,175 B2
(45) Date of Patent: Jul. 28, 2015

(54) SIGNAL MARGIN CENTERING FOR SINGLE-ENDED EDRAM SENSE AMPLIFIER

(71) Applicant: International Business Machines Corporation, Armonk, NY (US)

(72) Inventors: John E. Barth, Jr., Williston, VT (US); John A. Fifield, Underhill, VT (US); Mark D. Jacunski, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 227 days.

(21) Appl. No.: 13/851,202

(22) Filed: Mar. 27, 2013

(65) Prior Publication Data

US 2014/0293715 A1    Oct. 2, 2014

(51) Int. Cl.
*G11C 11/24* (2006.01)
*G11C 7/00* (2006.01)
*G11C 5/14* (2006.01)
*G11C 11/4091* (2006.01)
*G11C 7/06* (2006.01)
*G11C 11/4094* (2006.01)
*G11C 11/4097* (2006.01)

(52) U.S. Cl.
CPC ............ *G11C 11/4091* (2013.01); *G11C 7/067* (2013.01); *G11C 11/4094* (2013.01); *G11C 11/4097* (2013.01)

(58) Field of Classification Search
USPC .................................. 365/149, 203, 205, 226
See application file for complete search history.

(56) References Cited

U.S. PATENT DOCUMENTS

| | | | |
|---|---|---|---|
| 4,669,063 A * | 5/1987 | Kirsch | 365/149 |
| 4,763,026 A | 8/1988 | Tsen et al. | |
| 6,552,944 B2 * | 4/2003 | Fifield et al. | 365/203 |
| 6,580,650 B2 | 6/2003 | Ellis et al. | |
| 6,580,655 B2 | 6/2003 | Jacunski et al. | |
| 7,099,216 B2 | 8/2006 | Luk et al. | |
| 7,180,814 B2 * | 2/2007 | Luk et al. | 365/226 |
| 7,277,339 B2 | 10/2007 | Edahiro | |

(Continued)

FOREIGN PATENT DOCUMENTS

| | | |
|---|---|---|
| CN | 101989466 A | 3/2011 |
| EP | 001241676 A1 | 9/2002 |
| JP | 2005050446 A | 2/2005 |

OTHER PUBLICATIONS

Luk, W.K. et al; "A novel dynamic memory cell with internal voltage gain."; Solid-State Circuits, IEEE Journal of , vol. 40, No. 4, pp. 884-894, Apr. 2005.

*Primary Examiner* — Trong Phan
(74) *Attorney, Agent, or Firm* — Gibb & Riley, LLC; David A. Cain, Esq.

(57) ABSTRACT

Apparatus and methods for signal margin centering for single-ended eDRAM sense amplifier. A plurality of DRAM cells is connected to an input side of a multiplexer by a first bitline. A single-ended sense amplifier is connected to an output side of the multiplexer by a second bitline. The single-ended sense amplifier has a switch voltage. The second bitline is precharged to a selected voltage level. The multiplexer passes a signal voltage from a selected one of the plurality of DRAM cells to the second bitline. The selected voltage level is selected such that reception of the signal voltage of a first type adjusts a voltage of the second bitline in a first direction and reception of the signal voltage of a second type adjusts the voltage of the second bitline in a second direction opposite from the first direction, centering the signal voltage around the switch voltage.

20 Claims, 9 Drawing Sheets

(56) References Cited

U.S. PATENT DOCUMENTS

| | | |
|---|---|---|
| 7,692,990 B2 | 4/2010 | Barth, Jr. |
| 7,920,434 B2 * | 4/2011 | Meterelliyoz et al. ........ 365/203 |
| 7,933,141 B2 | 4/2011 | Kajigaya et al. |
| 7,990,793 B2 | 8/2011 | Kajigaya |
| 8,014,218 B2 | 9/2011 | Barth, Jr. |
| 8,045,360 B2 | 10/2011 | Kajigaya |
| 8,179,735 B2 | 5/2012 | Wu |
| 8,462,574 B2 * | 6/2013 | Breen et al. .................... 365/149 |
| 8,588,019 B2 * | 11/2013 | Kajigaya ....................... 365/203 |
| 2002/0131312 A1 | 9/2002 | Issa et al. |
| 2004/0037138 A1 | 2/2004 | Barth, Jr. |
| 2005/0052897 A1 | 3/2005 | Luk et al. |
| 2009/0251947 A1 | 10/2009 | Kajigaya |

\* cited by examiner

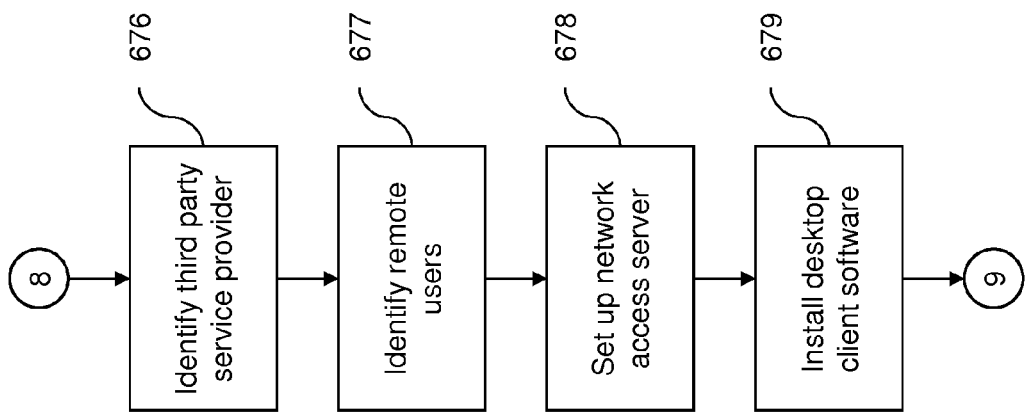

SIGNAL MARGIN CENTERING FOR SINGLE-ENDED EDRAM SENSE AMPLIFIER

BACKGROUND

The present disclosure relates to sense circuits for semiconductor devices. More particularly, the disclosure relates to semiconductor devices that incorporate a voltage compensation device to center a band of 'high' and 'low' eDRAM bitline signals around the switch point of a single-ended sense amplifier.

In conventional dynamic random-access memory (DRAM), the sense signal from a memory cell is generated by charge sharing the charge stored in the memory cell with a precharged bitline, and then the developed sense signal on the precharged bitline is compared to a reference bitline.

DRAM arrays generate bitline voltages which must be interpreted as being 'high' or 'low' to discern between a '1' or '0' digital state. Traditional differential sense schemes use a reference voltage level which can be centered between the expected band of '0' data-voltage levels and expected '1' data-voltage levels. Differential sense systems have one input to receive a reference-voltage level and another input to receive a data-voltage signal and an analog comparison is made to distinguish 'high' and 'low' logic states. The ability to center the reference level between the data levels allows for optimized yield, reliability and allows signal margin testing.

To achieve maximum density, a large number of memory cells are typically connected to a single bitline in order to reduce the area overhead of the local amplifier. However, adding cells to a bitline also increases the bitline capacitance, and consequently reduces the transfer ratio ($C_{cell}/(C_{b1}+C_{cell})$), which in turn reduces the developed sense signal. Typically, the number of bits (memory cells) per bitline is chosen to minimize the number of sense amps (overhead) while maintaining enough sense signal to detect the stored state of a memory cell reliably.

The amplitude of the sense signal $\Delta Vb1$ from a memory cell is a function of the cell capacitance, the bitline capacitance, the cell voltage and the bitline precharge voltage, as set forth in the following formula:

$$\Delta Vb1 = (V_{cell} - V_{BLEQ}) * (C_{cell}/(C_{b1}+C_{cell}))$$

where
- $V_{cell}$=voltage stored in the memory cell;
- $V_{BLEQ}$=bitline precharge voltage;
- $C_{cell}$=cell capacitance; and
- $C_{b1}$=bitline capacitance.

Newer embedded DRAM (eDRAM) arrays use a single-ended sense scheme wherein bitlines are directly coupled to a sensing-inverter having a switch-point voltage. The eDRAM array bitlines are shortened to increase the bitline signal levels and the data-level is sensed as being above or below the inverter switch-point voltage. The sensing-inverter switch-point voltage is a function of NFET and PFET Vt, transconductance, temperature and supply voltage (PVT), and moves largely independent from bitline signal level changes.

Single-ended sense schemes have no means to adjust their voltage switch points as do traditional differential sense schemes using a cross-coupled 2-input sense amplifier for example. The ability to center the switch-point on the midpoint of the '0' and '1' data voltage levels is lost using single-ended sense schemes.

The loss of this centering function makes it difficult to design and test an eDRAM array for high yield, maximum retention, and reliability. True signal margin testing cannot be performed. Efforts to compensate for this loss of signal centering by adjustments in Vdd, or by restrictions in operating temperature limit customer usage and make a design uncompetitive. Tighter manufacturing controls can improve the eDRAM yield but increase manufacturing costs.

SUMMARY

According to a method herein, a first bitline is precharged to a first voltage level. A plurality of dynamic random-access memory (DRAM) cells is operatively connected to an input side of a multiplexer device by the first bitline. A second bitline is precharged to a second voltage level. A sense device is operatively connected to an output side of the multiplexer device by the second bitline. The sense device has a switch voltage and comprises a pair of transistors arranged in an inverter configuration and a read enable transistor operatively connected to the pair of transistors. The read enable transistor is connected to a third voltage level. The second voltage level is such that reception of a signal voltage of a first type adjusts a voltage of the second bitline in a first direction and reception of the signal voltage of a second type adjusts the voltage of the second bitline in a second direction opposite from the first direction. The second voltage centers the signal voltage around the switch voltage. The first voltage level, the second voltage level, and the third voltage level are different voltages. Using the multiplexer, the signal voltage is passed from a selected one of the plurality of DRAM cells to the second bitline through the first bitline.

According to a method herein, power is supplied to a global bitline using a first power supply at a predetermined potential. The global bitline is operatively connected to a sense device. The sense device has a switch voltage. A signal voltage is sensed from a dynamic random-access memory (DRAM) cell operatively connected to the global bitline using the sense device, the potential of the global bitline is controlled by controlling an output voltage of the first power supply such that reception of the signal voltage of a first type adjusts the potential of the global bitline in a first direction and reception of the signal voltage of a second type adjusts the potential of the global bitline in a second direction opposite from the first direction. The signal voltage is centered on the switch voltage.

According to a semiconductor device herein, the semiconductor device comprises a plurality of dynamic random-access memory (DRAM) cells. A complementary metal-oxide-semiconductor (CMOS) multiplexer is operatively connected to each of the plurality of DRAM cells through a first bitline. A first transistor operatively connects the first bitline to a first voltage. A second bitline is operatively connected to the CMOS multiplexer. A second transistor operatively connects the second bitline to a second voltage. A sense device is operatively connected to the second bitline. The sense device comprises a CMOS inverter having a switch voltage and a third transistor operatively connecting the CMOS inverter to a third voltage. The CMOS multiplexer passes a signal voltage from a selected one of the plurality of DRAM cells to the second bitline through the first bitline. The second voltage is selected such that reception of the signal voltage of a first type adjusts a voltage of the second bitline in a first direction and reception of the signal voltage of a second type adjusts the voltage of the second bitline in a second direction opposite from the first direction, centering the signal voltage around the switch voltage. The first voltage, the second voltage, and the third voltage are different voltages.

BRIEF DESCRIPTION OF THE DRAWINGS

The systems and methods herein will be better understood from the following detailed description with reference to the drawings, which are not necessarily drawn to scale and in which:

FIG. 9 is a schematic diagram of a virtual private network system according to systems and methods herein.

DETAILED DESCRIPTION

Figure 1:
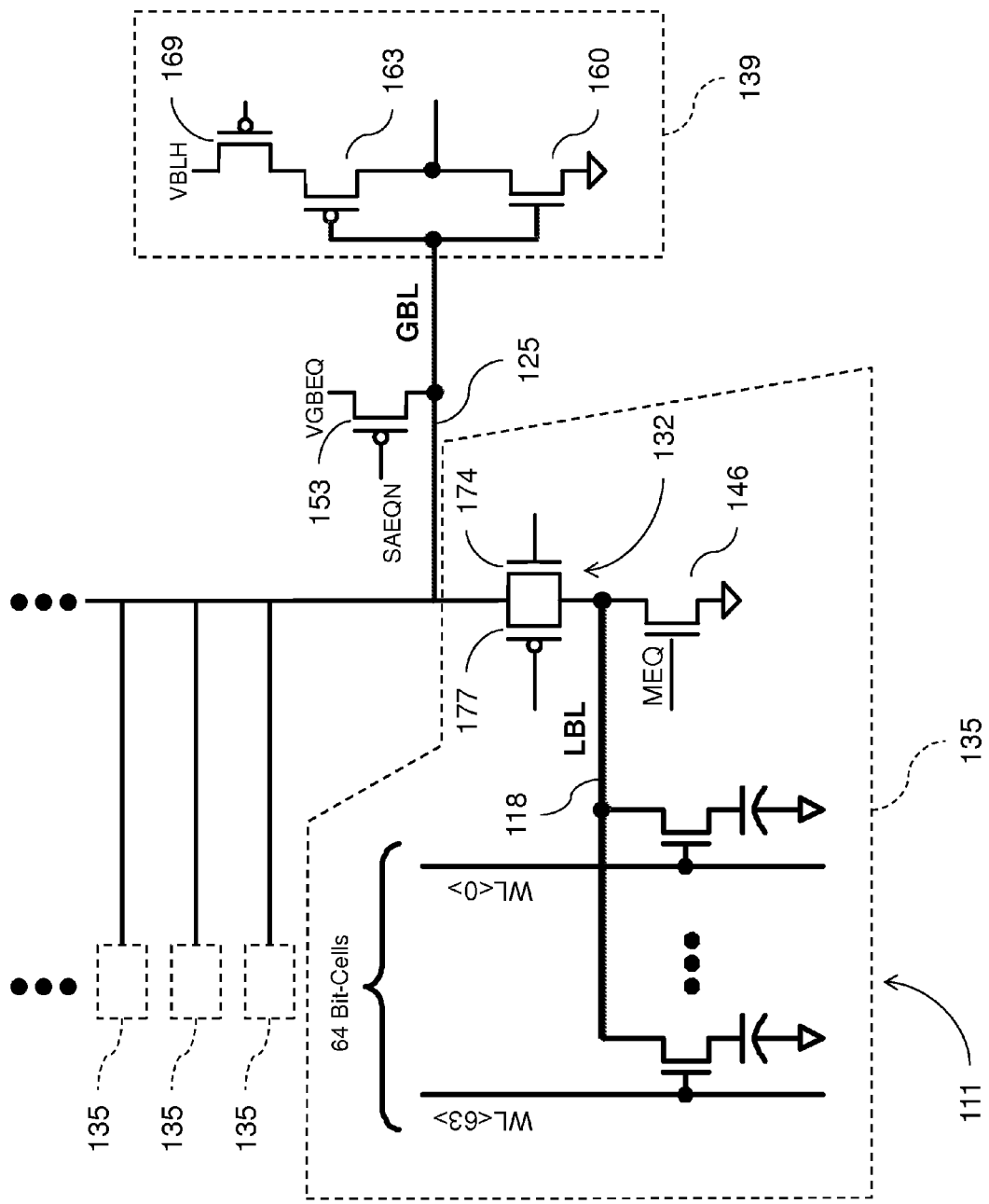
FIG. 1 is a circuit diagram illustrating systems and methods herein.

FIG. 1 shows a dynamic random-access memory (DRAM) array, indicated generally as 111, with a segmented bitline architecture. The structure shown in FIG. 1 is only an example, and those ordinarily skilled in the art would understand that the systems and methods described herein could be applied and used with any structures similar to FIG. 1.

In this example, the DRAM array 111 comprises a plurality of DRAM cells integrated on the same die arranged along 64 word lines (WL<0>-WL<63>). As used herein, the DRAM cells may be referred to as eDRAM, for embedded DRAM. Each group of 64 bit-cells of the DRAM array 111 is connected to a local bitline 118, sometimes referred to herein as LBL. The LBL 118 is coupled to a global bitline 125, sometimes referred to herein as GBL, through a multiplexer device 132. According to systems and methods herein, the multiplexer device 132 may comprise a CMOS multiplexer.

For convenience, the LBL 118, group of 64 bit-cells, and multiplexer device 132 may be referred to collectively herein as a bit-package 135. As shown in the example of FIG. 1, the array 111 may include a plurality of bit packages 135. For example, FIG. 1 shows an array 111 having 64 word lines (WL<0>-WL<63>) and four local bitlines ($LBL_0$-$LBL_3$). This yields an array of 256 cells. Other numbers of local bitlines can be used; for example, an array 111 having 64 word lines and 8 local bitlines would yield an array of 512 cells.

FIG. 1 shows the connection of LBL 118 to global bitline GBL 125 through multiplexer device 132. The GBL 125 is coupled to a single-ended sense device 139.

The LBL 118 has a transistor 146 connected between the LBL 118 and ground. The transistor 146 provides a voltage precharge to the LBL 118. According to systems and methods herein, the transistor 146 may comprise an N-channel field-effect transistor (NFET). The GBL 125 has a transistor 153 connected between the GBL 125 and a voltage input (VGBEQ). As described in further detail below, VGBEQ is the voltage applied to the global bitline that equalizes the high and low data levels of the DRAM cells on either side of the switching voltage of the single-ended sense device 139. The transistor 153 provides a voltage precharge to the GBL 125.

The initial value for VGBEQ is approximated by electrical modeling of the DRAM array and sensing system during circuit design, depending on the parasitic capacitance on the first and second bitline structures, the input capacitance of the sensing devices, and the actual leakage incurred on the stored charge in the DRAM cells. These values can be approximated during design of the integrated circuit to calculate an initial value for VGBEQ, as described in further detail below. The value of VGBEQ can be refined during electrical test of the integrated circuit. According to systems and methods herein, the transistor 153 may comprise a P-channel field-effect transistor (PFET).

The single-ended sense device 139 may be an inverter or logic gate having a switch voltage. The cells of the DRAM array 111 have 'high' and 'low' data levels providing an expected voltage-level band. The VGBEQ voltage level is chosen to pre-charge the voltage of the GBL 125 such that charge sharing will center the 'high' and 'low' data levels around the switch voltage.

The single-ended sense device 139 may comprise a pair of transistors in an inverter configuration, such as a CMOS inverter having an NFET 160 connected gate-to-gate and drain-to-drain to a PFET 163. The source terminal of the NFET 160 is connected to ground and the source terminal of the PFET 163 is connected to a read enable transistor 169 that is connected between the PFET 163 and a voltage input VBLH. According to systems and methods herein, the read enable transistor 169 may comprise a PFET.

The circuit illustrated in FIG. 1 uses one power supply (VBLH) to power the single-ended sense device 139, and another power supply VGBEQ to precharge the GBL 125.

The multiplexer device 132 may comprise a complementary metal-oxide-semiconductor (CMOS) multiplexer having NFETs 174 connected source-to-source and drain-to-drain to PFETs 177.

According to systems and methods herein, the global bitline 125 may be coupled to a plurality of multiplexer devices 132 wherein each of the plurality of multiplexer devices 132 is coupled to respective local bitlines 118, which are each connected to a plurality of DRAM cells. Each of the multiplexer devices 132 has a distinct decode signal such that when activated, the selected multiplexer device 132 will connect data signals from a selected LBL 118 to GBL 125. In this arrangement, an array 111 of DRAM cells can be multiplexed to one single-ended sense device 139 by decoding and selection of a desired multiplexer device 132. In other words, a single wordline and single multiplexer device is selected to choose a single DRAM cell.

The exemplary circuit illustrated in FIG. 1 connects a selected local bitline 118 to a global bit line 125 through the CMOS multiplexer device 132. The local bitline 118 is restored to ground through transistor 146 to prevent body-charge-up modulation of the DRAM cell voltage. The global bit line 125 is connected to the single-ended sense device 139 and is precharged to a level VGBEQ through transistor 153. The VGBEQ level is specifically chosen such that reception of cell data of one type will move the potential of the GBL 125 in a first direction and reception of cell data of the opposite type will move the potential of the GBL 125 in a second direction opposite from the first direction.

The systems and methods herein center the common-mode data-point of the GBL 125 near the switch point of the single-ended sense device 139 such that data of a first type will move the GBL line potential above the precharge level and data of the opposite type from the first type will move the GBL line potential below the precharge level. That is, the common mode of GBL node is varied by changing VGBEQ voltage →Raising VGBEQ, makes the "0" work harder to trip the sense device;
→Lowering VGBEQ, margins the "1" data-retention.

In the non-limiting example shown in FIG. 1, 64 DRAM cells are connected to the local bitline 118, which has a capacitance $C_{LBL}$. In this particular example, prior to READ operations, the system is in pre-charge:
  i. all wordlines (WLs) are low,
  ii. multiplexer devices are off,
  iii. local bitlines 118 are coupled to GND through NFET transistor 146, and
  iv. the global bitline 125 is coupled to VGBEQ through PFET transistor 153.

At the beginning of a READ operation, one of a plurality of the local bitlines 118 is coupled to the global bitline 125 having a capacitance $C_{GBL}$, through a multiplexer device 132. Given enough time for the charge to distribute completely, the voltage of the global bitline is given by $$V_{GBL} = V_{GBEQ} \times \frac{C_{GBL}}{C_{GBL} + C_{LBL} + C_N} + V_N \times \frac{C_N}{C_{GBL} + C_{LBL} + C_N}$$

where
  $V_{GBL}$ is the voltage of the GBL at the completion of signal development,
  $V_{GBEQ}$ is the GBL pre-charge voltage,
  $V_N$ is the bitcell node voltage at the start of the READ,
  $C_{GBL}$ is the GBL capacitance,
  $C_{LBL}$ is the LBL capacitance, and
  $C_N$ is the bitcell node capacitance.

If the switch voltage of the single-ended sense device 139 is Vswitch, then when $V_{GBL}$>Vswitch→$V_{GBL}$ is interpreted as a "1", and when $V_{GBL}$<Vswitch→$V_{GBL}$ is interpreted as a "0".

Figure 2:
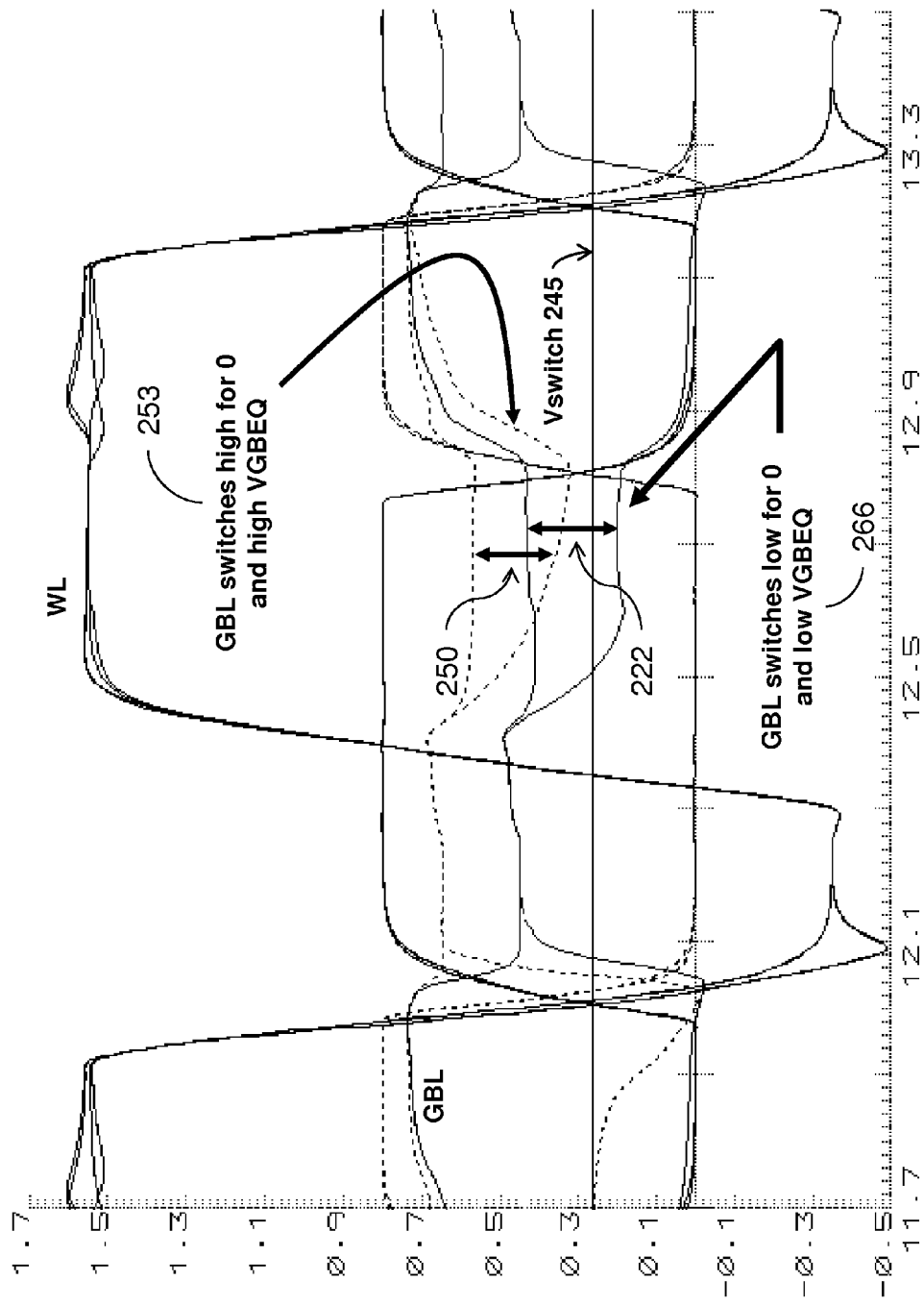
FIG. 2 is a waveform diagram showing variations in potential in an integrated circuit according to systems and methods herein.

FIG. 2 shows the signal waveforms for a READ operation. During the first part of the operation, signal development, the following occurs:
  i. the SAEQ and MEQ pre-charge devices are turned-off (not shown),
  ii. a single WL goes high, transferring charge from a bitcell to the LBL 118, and
  iii. a single MUX device is turned-on, resulting in charge sharing between the LBL 118 and GBL 125.

The difference between VGBL of a "0" and VGBL of a "1" is called the signal margin window. To optimize yield, it is desirable that the signal margin window, such as shown at 222, be centered about Vswitch 245, the voltage level at which the single-ended sense device 139 will switch from high to low (on to off, 0 to 1, etc.), as shown in FIG. 2. The systems and methods herein provide the ability to move the signal margin window relative to Vswitch 245, which is extremely valuable for test and characterization.

The switch point, Vswitch 245, of the single-ended sense device 139 formed by PFET 163 and NFET 160 in FIG. 1, is determined by the threshold voltages and the relative strengths of PFET 163 and NFET 160 as determined by their device widths and lengths, and device gamma, and by supply voltage, VBLH. Those ordinarily skilled in the art would understand that the switch point of the single-ended sense device 139 would be similarly calculated for different structures. While the thresholds can be selected from among a limited set of device types during design, they cannot be varied in hardware. Furthermore, the VBLH supply is often limited by reliability and retention issues.

Since Vswitch 245 is difficult to change for a given hardware design, the systems and methods herein move the signal margin window instead. It can be seen from the $V_{GBL}$ equation above that this is readily done by adjusting the VGBEQ voltage. FIG. 2 shows a signal margin window 250 that is entirely above the switching voltage, Vswitch 245, resulting in a failed READ 0 for a high VGBEQ (as indicated at 253). That is, the GBL switches high for a "0" and high pre-charge voltage VGBEQ. FIG. 2 also shows a signal margin window 222 that is centered about the switching voltage, Vswitch 245, resulting in a passing READ 0 for a low VGBEQ (as indicated at 266). That is, the GBL switches low for a "0" and low pre-charge voltage VGBEQ, demonstrating that varying VGBEQ is an effective method of centering the signal margin window.

It has been found that lowering VGBEQ reduces the conductance of transistor 153 in FIG. 1, which reduces the speed with which the potential of GBL 125 is restored to the pre-charge level. This can be addressed by boosting the gate of transistor 153 to a negative voltage below GND. The waveforms in FIG. 2 demonstrate very high-speed operation (833 MHz) for an SAEQN low-level of −0.35V. Other voltages may be used.

The systems and methods herein center a band of 'high' and 'low' bitline signals around the switch point of a single-ended sense amplifier. In order to do this, a local bit line is precharged at ground to prevent body-charge-up modulation of the access transformer voltage. A global bitline is pre-charged to a different level to allow centering of the '1' and '0' data voltage levels around the switch point of the single-ended sense amplifier.

Figure 3:
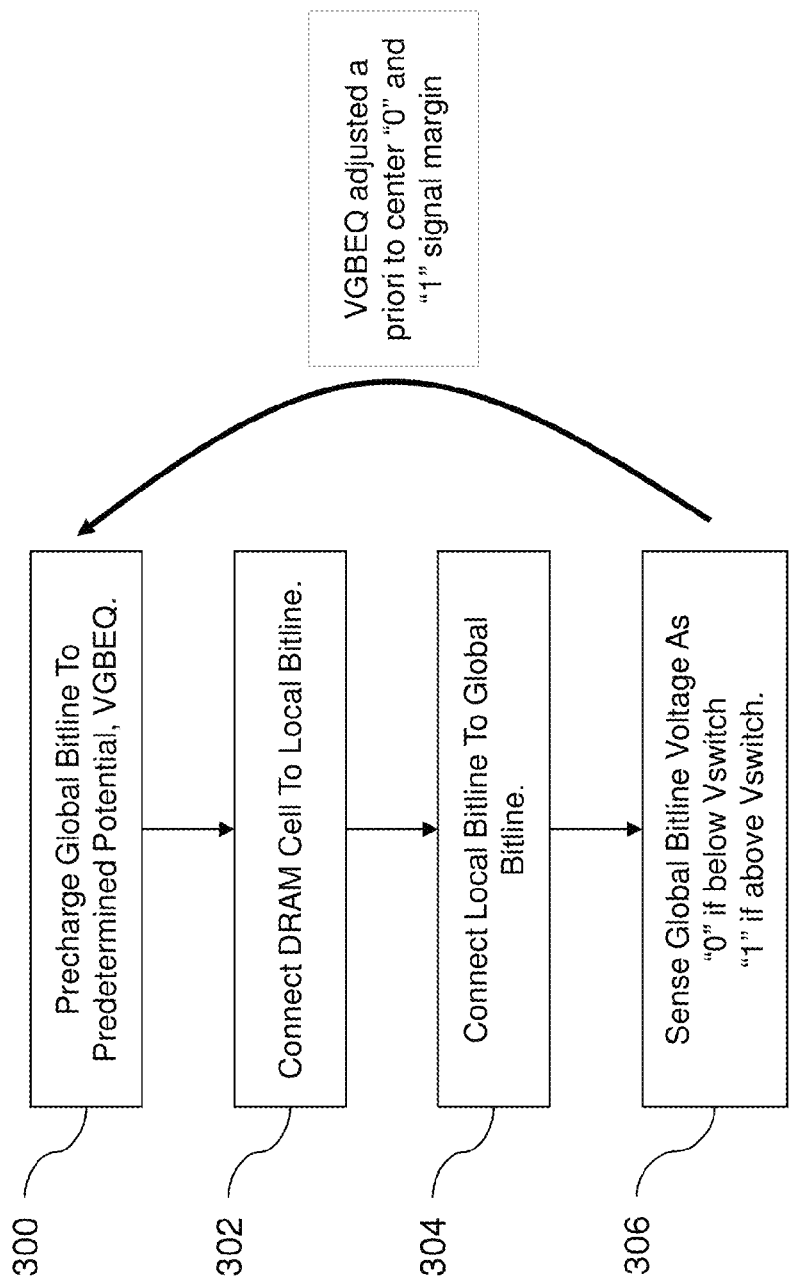
FIG. 3 is a flow diagram illustrating methods herein.

FIG. 3 is a flow diagram illustrating the processing flow of an exemplary method of centering signal margin for a single-ended eDRAM sense amplifier according to systems and methods herein. In item 300, a global bitline is precharged to a predetermined potential, VGBEQ, such that charge sharing will center the 'high' and 'low' data levels on the switch voltage. As would be understood by those ordinarily skilled in the art, any precharge voltage could be used, and the pre-charge voltage will be different for different devices (depending upon device makeup, size, speed, etc.).

The eDRAM cell is connected to the local bitline in item 302 and to the global bitline in item 304. In item 306, the global bitline is then sensed as a "0" if the global bitline voltage, $V_{GBL}$, is below the sense device switch point, Vswitch, and as a "1" if $V_{GBL}$ is above Vswitch. Note, VGBEQ may be adjusted a priori to center the "0" and "1" signal margin. The voltage value of VGBEQ can be determined by adjusting the set point of a voltage regulator configured to regulate voltage VGBEQ. In such a system, a reference, or target voltage is adjusted by a digital to analog (DAC) circuit and the voltage regulator holds VGBEQ to the predetermined reference voltage. According to systems and methods herein, target voltages may be generated on-chip by a bandgap reference circuit, or may be an input to the integrated circuit.

The voltage level of VGBEQ can be determined by signal margin testing of the eDRAM array. Margin testing can be performed on a DRAM memory by a number of means. In one such method, the power supply voltage can be adjusted to its minimum and/or maximum value and the operating temperature can be raised, and/or lowered to its upper and lower values creating a matrix of 4-tests. The voltage value of VGBEQ can be adjusted through a range as each of the DRAM cells is tested for correct retention of '1' and '0' data types. Pass/fail maps can be made by overlapping a number of tests and VGBEQ can be centered at a point giving test margin to all tests.

As mentioned above, the sensing-inverter switch-point voltage is a function of NFET and PFET Vt, transconductance, temperature and supply voltage (PVT), and is independent from bitline signal level changes. Conventional single-ended sense amplifiers have no means to adjust their voltage switch points as do traditional differential sense schemes using a cross-coupled 2-input sense amplifier, for example. In view of this, systems and methods herein center a band of 'high' and 'low' eDRAM bitline signals around the switch point of a single-ended sense amplifier. In order to do this, systems and methods herein precharge a local bit line at ground to prevent body-charge-up modulation of the access transformer voltage, and precharge the global bitline to a different level that allows centering of the '1' and '0' data voltage levels.

Thus, by precharging a local bit line at ground and precharging the global bitline to a different level, the systems and methods herein can center a band of 'high' and 'low' bitline signals around the switch point of a single-ended sense amplifier. By doing so, the systems and methods herein provide the ability to center the '0' and '1' data voltage levels on the center of the switch-point. This makes it possible to design and test an eDRAM array for high yield, maximum retention, and reliability, and to allow true signal margin testing.

Aspects of the present disclosure are described herein with reference to flowchart illustrations and/or block diagrams of methods, apparatus (systems) and computer program products according to various systems and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

According to a further system and method herein, an article of manufacture is provided that includes a tangible computer readable medium having computer readable instructions embodied therein for performing the steps of the computer implemented methods, including, but not limited to, the method illustrated in FIG. 3. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 3.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the systems and methods herein by software and/or firmware, a program constituting the software may be installed into a computer with dedicated hardware, from a storage medium or a network, and the computer is capable of performing various functions if with various programs installed therein.

Figure 4:
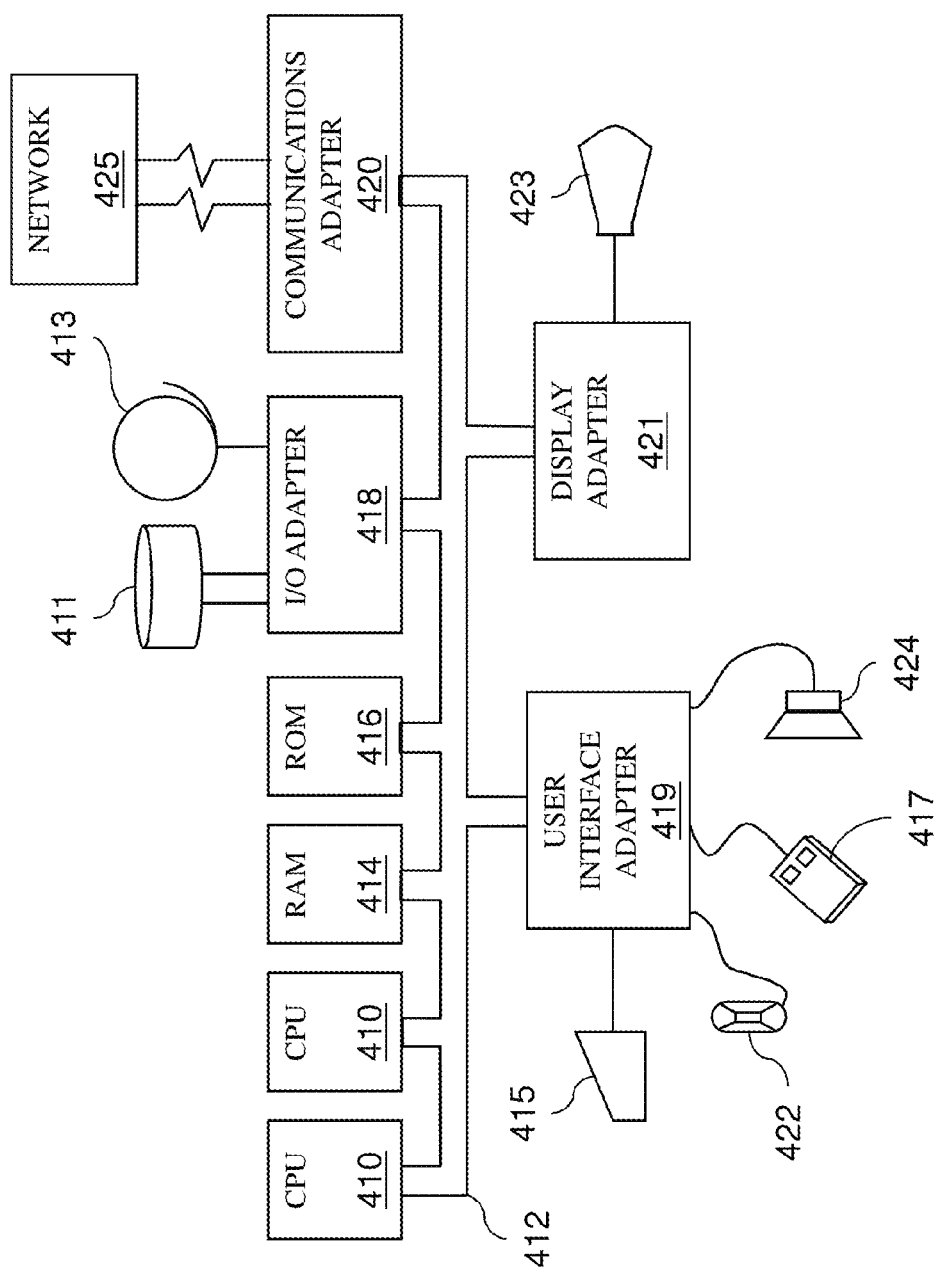
FIG. 4 is a schematic diagram of a hardware system according to systems and methods herein.

A representative hardware environment for practicing the systems and methods herein is depicted in FIG. 4. This schematic drawing illustrates a hardware configuration of an information handling/computer system in accordance with the systems and methods herein. The system comprises at least one processor or central processing unit (CPU) 410. The CPUs 410 are interconnected via system bus 412 to various devices such as a Random Access Memory (RAM) 414, Read Only Memory (ROM) 416, and an Input/Output (I/O) adapter 418. The I/O adapter 418 can connect to peripheral devices, such as disk units 411 and tape drives 413, or other program storage devices that are readable by the system. The system can read the inventive instructions on the program storage devices and follow these instructions to execute the methodology of the systems and methods herein.

In FIG. 4, CPUs 410 perform various processing based on a program stored in a Read Only Memory (ROM) 416 or a program loaded from a peripheral device, such as disk units 411 and tape drives 413 to a Random Access Memory (RAM) 414. In the RAM 414, required data when the CPU 410 performs the various processing or the like is also stored, as necessary. The CPU 410, the ROM 416, and the RAM 414 are connected to one another via a bus 412. An input/output adapter 418 is also connected to the bus 412 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 414, as necessary.

The system further includes a user interface adapter 419 that connects a keyboard 415, mouse 417, speaker 424, microphone 422, and/or other user interface devices such as a touch screen device (not shown) to the bus 412 to gather user input. Additionally, a communication adapter 420 including a network interface card such as a LAN card, a modem, or the like connects the bus 412 to a data processing network 425. The communication adapter 420 performs communication processing via a network such as the Internet. A display adapter 421 connects the bus 412 to a display device 423, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium such as the removable medium.

Those skilled in the art would appreciate that, the storage medium is not limited to the peripheral device having the program stored therein as illustrated in FIG. 4, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 416, a hard disk contained in the storage section 411, or the like, which has the program stored therein and is distributed to the user together with the device that contains them.

As will be appreciated by one skilled in the art, aspects of the systems and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read Only Memory (ROM), an Erasable Programmable Read Only Memory (EPROM or Flash memory), an optical fiber, a magnetic storage device, a portable compact disc Read Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various systems and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

For clarity, in FIGS. 5-9, the numbers in circles represent jump links to and from the indicated process steps or decision blocks, as described below. The actual lines are not shown in order to avoid cluttering the drawings.

Figure 5:
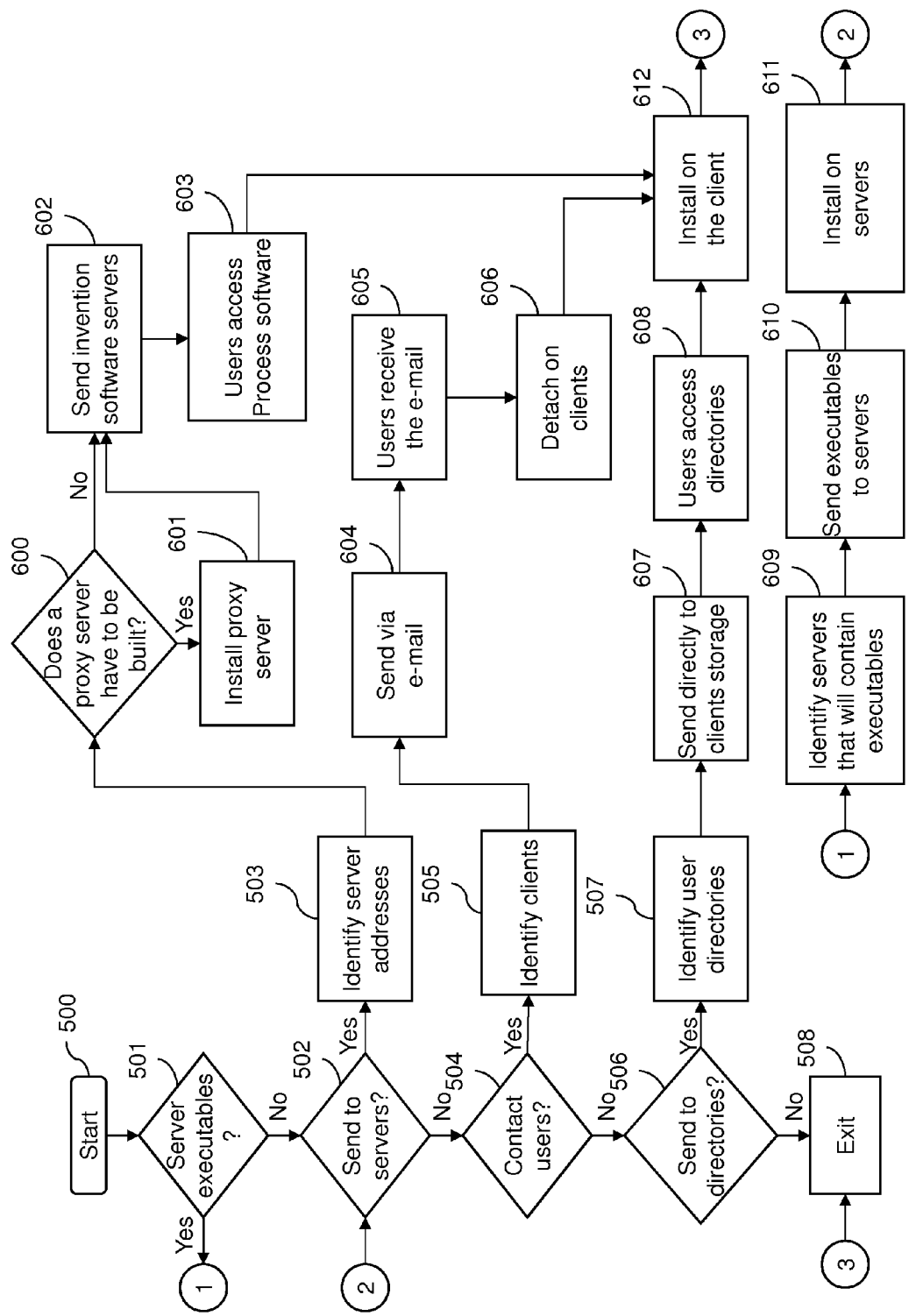
FIG. 5 is a schematic diagram of a deployment system according to systems and methods herein.

In FIG. 5, step 500 begins the deployment of the process software. The first thing is to determine if there are any programs that will reside on a server or servers when the process software is executed 501. If this is the case, then the servers that will contain the executables are identified 609. The process software for the server or servers is transferred directly to the servers' storage via FTP or some other protocol, or by copying through the use of a shared file system 610. The process software is then installed on the servers 611.

Next, a determination is made on whether the process software is to be deployed by having users access the process software on a server or servers 502. If the users are to access the process software on servers, then the server addresses that will store the process software are identified 503.

A determination is made if a proxy server is to be built 600 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed 601. The process software is either sent to the servers via a protocol such as FTP or it is copied directly from the source files to the server files via file sharing 602. Another method would be to send a transaction to the servers that contain the process software and have the server process the transaction, then receive and copy the process software to the server's file system. Once the process software is stored at the servers, the users, via their client computers, then access the process software on the servers and copy it to their client computers file systems 603. Another method is to have the servers automatically copy the process software to each client and then run the installation program for the process software at each client computer. The users execute the program that installs the process software on their client computer 612, and then exit the process 508.

In step 504, a determination is made whether the process software is to be deployed by sending the process software to users via e-mail. The set of users where the process software will be deployed are identified together with the addresses of the user client computers 505. The process software is sent via e-mail 604 to each of the users' client computers. The users receive the e-mail 605 and then detach the process software from the e-mail to a directory on their client computers 606. The users execute the program that installs the process software on their client computer 612, and then exit the process 508.

Lastly, a determination is made on whether the process software will be sent directly to user directories on their client computers 506. If so, the user directories are identified 507. The process software is transferred directly to the users' client computer directory 607. This can be done in several ways such as, but not limited to, sharing of the file system directories and then copying from the sender's file system to the recipient users' file system or alternatively using a transfer protocol such as File Transfer Protocol (FTP). The users access the directories on their client file systems in preparation for installing the process software 608. The users execute the program that installs the process software on their client computer 612, and then exit the process 508.

The process software is integrated into a client, server, and network environment by providing for the process software to coexist with applications, operating systems, and network operating systems software, and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists match the parameter lists required by the process software. Conversely, parameters passed by the software applications to the process software will be checked to ensure the parameters match the parameters required by the process software. The client and server operating systems including the network operating systems will be identified and compared to the list of operating systems, version numbers, and network software that have been tested to work with the process software. Those operating systems, version numbers, and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 6:
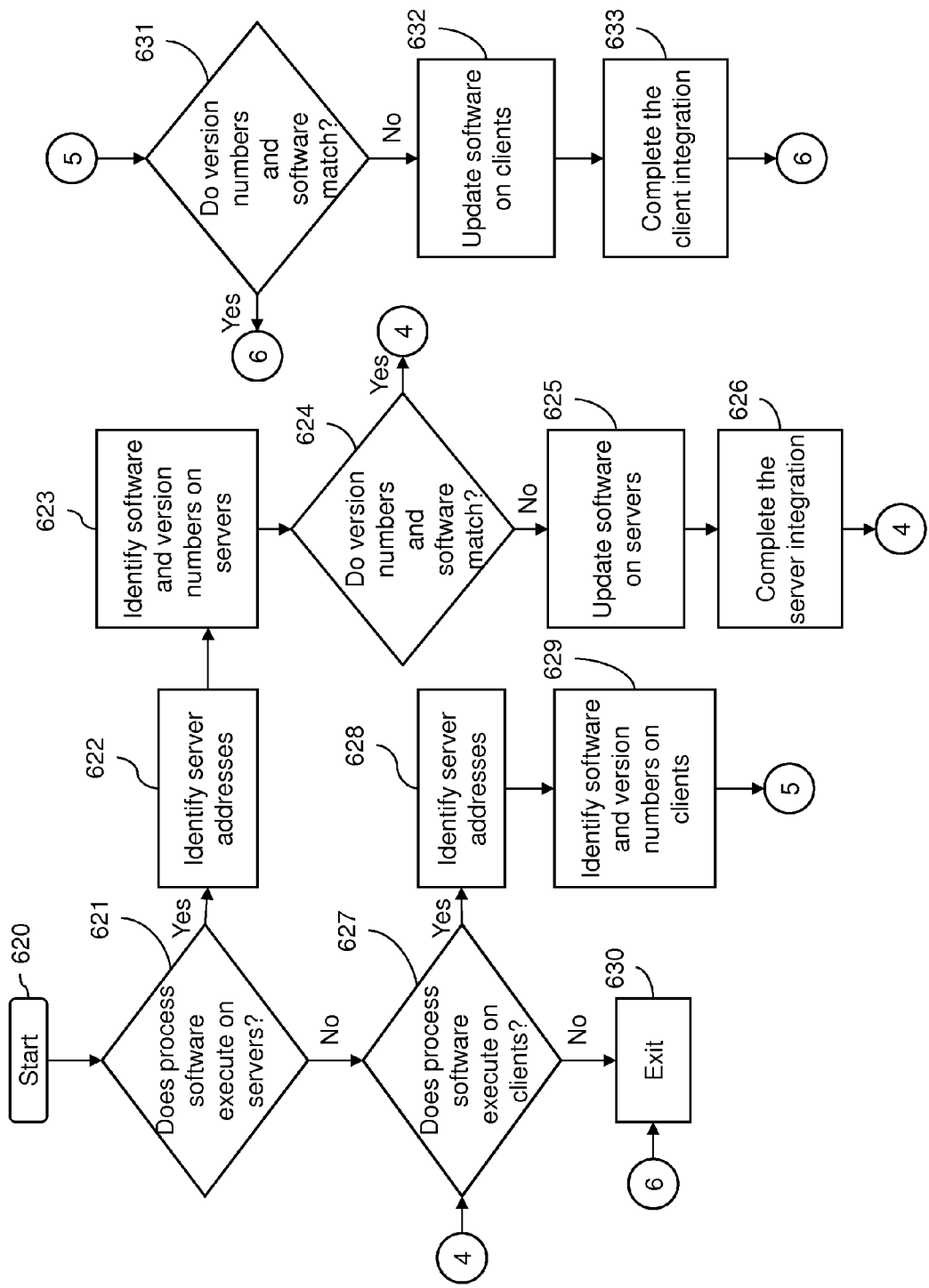
FIG. 6 is a schematic diagram of an integration system according to systems and methods herein.

In FIG. 6, step 620 begins the integration of the process software. The first thing is to determine if there are any process software programs that will execute on a server or servers 621. If this is not the case, then integration proceeds to 627. If this is the case, then the server addresses are identified 622. The servers are checked to see if they contain software that includes the operating system (OS), applications, and network operating systems (NOS), together with their version numbers that have been tested with the process software 623. The servers are also checked to determine if there is any missing software that is required by the process software 623.

A determination is made if the version numbers match the version numbers of OS, applications, and NOS that have been tested with the process software 624. If all of the versions match and there is no missing required software, the integration continues in 627.

If one or more of the version numbers do not match, then the unmatched versions are updated on the server or servers with the correct versions 625. Additionally, if there is missing required software, then it is updated on the server or servers 625. The server integration is completed by installing the process software 626.

Step 627, which follows either step 621, 624, or 626, determines if there are any programs of the process software that will execute on the clients. If no process software programs execute on the clients, the integration proceeds to 630 and exits. If this not the case, then the client addresses are identified 628.

The clients are checked to see if they contain software that includes the operating system (OS), applications, and network operating systems (NOS), together with their version numbers that have been tested with the process software 629. The clients are also checked to determine if there is any missing software that is required by the process software 629.

A determination is made as to whether the version numbers match the version numbers of OS, applications, and NOS that have been tested with the process software 631. If all of the versions match and there is no missing required software, then the integration proceeds to 630 and exits.

If one or more of the version numbers do not match, then the unmatched versions are updated on the clients with the correct versions 632. In addition, if there is missing required software then it is updated on the clients 632. The client integration is completed by installing the process software on the clients 633. The integration proceeds to 630 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally, the assessed server may make requests of other servers that require CPU units. CPU units are an example that represents one measurement of use. Other measurements of use include, but are not limited to, network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider. In another method, the service provider requests payment directly from a customer account at a banking or financial institution. In another method, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization, and it is scalable, providing capacity on demand in a pay-as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally, the assessed server may make requests of other servers that require CPU units. CPU units are an example that represents one measurement of use. Other measurements of use include, but are not limited to, network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider.

In another method, the service provider requests payment directly from a customer account at a banking or financial institution.

In another method, if the service provider is also a customer of the customer that uses the process software application, the payment owed to the service provider is reconciled to the payment owed by the service provider to minimize the transfer of payments.

Figure 7:
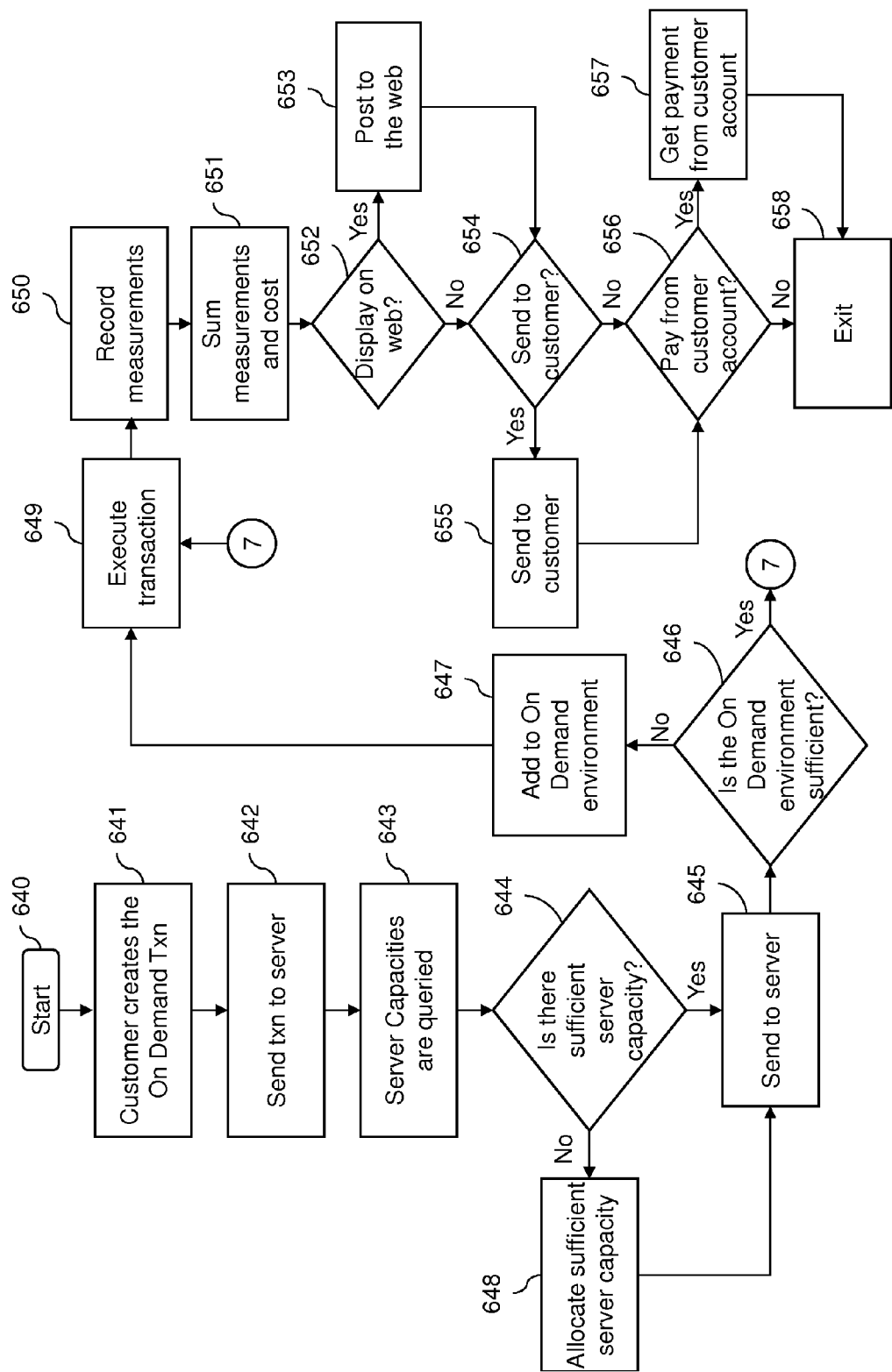
FIG. 7 is a schematic diagram of an on demand system according to systems and methods herein.

In FIG. 7, step 640 begins the On Demand process. A transaction is created that contains the unique customer identification, the requested service type, and any service parameters that further specify the type of service 641. The transaction is then sent to the main server 642. In an On Demand environment, the main server can initially be the only server, then, as capacity is consumed, other servers are added to the On Demand environment.

The server central processing unit (CPU) capacities in the On Demand environment are queried 643. The CPU requirement of the transaction is estimated, then the servers' available CPU capacity in the On Demand environment are compared to the transaction CPU requirement to see if there is sufficient CPU capacity available in any server to process the transaction 644. If there is not sufficient server CPU capacity available, then additional server CPU capacity is allocated to process the transaction 648. If there was already sufficient CPU capacity available, then the transaction is sent to a selected server 645.

Before executing the transaction, a check is made of the remaining On Demand environment to determine if the environment has sufficient available capacity for processing the transaction. This environment capacity consists of such things as, but not limited to, network bandwidth, processor memory, storage etc. 646. If there is not sufficient available capacity, then capacity will be added to the On Demand environment 647. Next, the required software to process the transaction is accessed, loaded into memory, then the transaction is executed 649.

The usage measurements are recorded 650. The usage measurements consist of the portions of those functions in the On Demand environment that are used to process the transaction. The usage of such functions as, but not limited to, network bandwidth, processor memory, storage and CPU cycles are what is recorded. The usage measurements are summed, multiplied by unit costs, and then recorded as a charge to the requesting customer 651. If the customer has requested that the On Demand costs be posted to a web site 652, then they are posted 653.

If the customer has requested that the On Demand costs be sent via e-mail to a customer address 654, then they are sent 655. If the customer has requested that the On Demand costs be paid directly from a customer account 656, then payment is received directly from the customer account 657. The last step is to exit the On Demand process 658.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed, and executed through either a remote-access or a site-to-site VPN. When using the remote-access VPNs, the process software is deployed, accessed, and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download, and execute the process software.

When using the site-to-site VPN, the process software is deployed, accessed, and executed through the use of dedicated equipment and large-scale encryption, which are used to connect a company's multiple fixed sites over a public network, such as the Internet.

The process software is transported over the VPN via tunneling, which is the process of placing an entire packet within another packet and sending it over a network. The protocol of the outer packet is understood by the network and both points, called tunnel interfaces, where the packet enters and exits the network.

Figure 8:
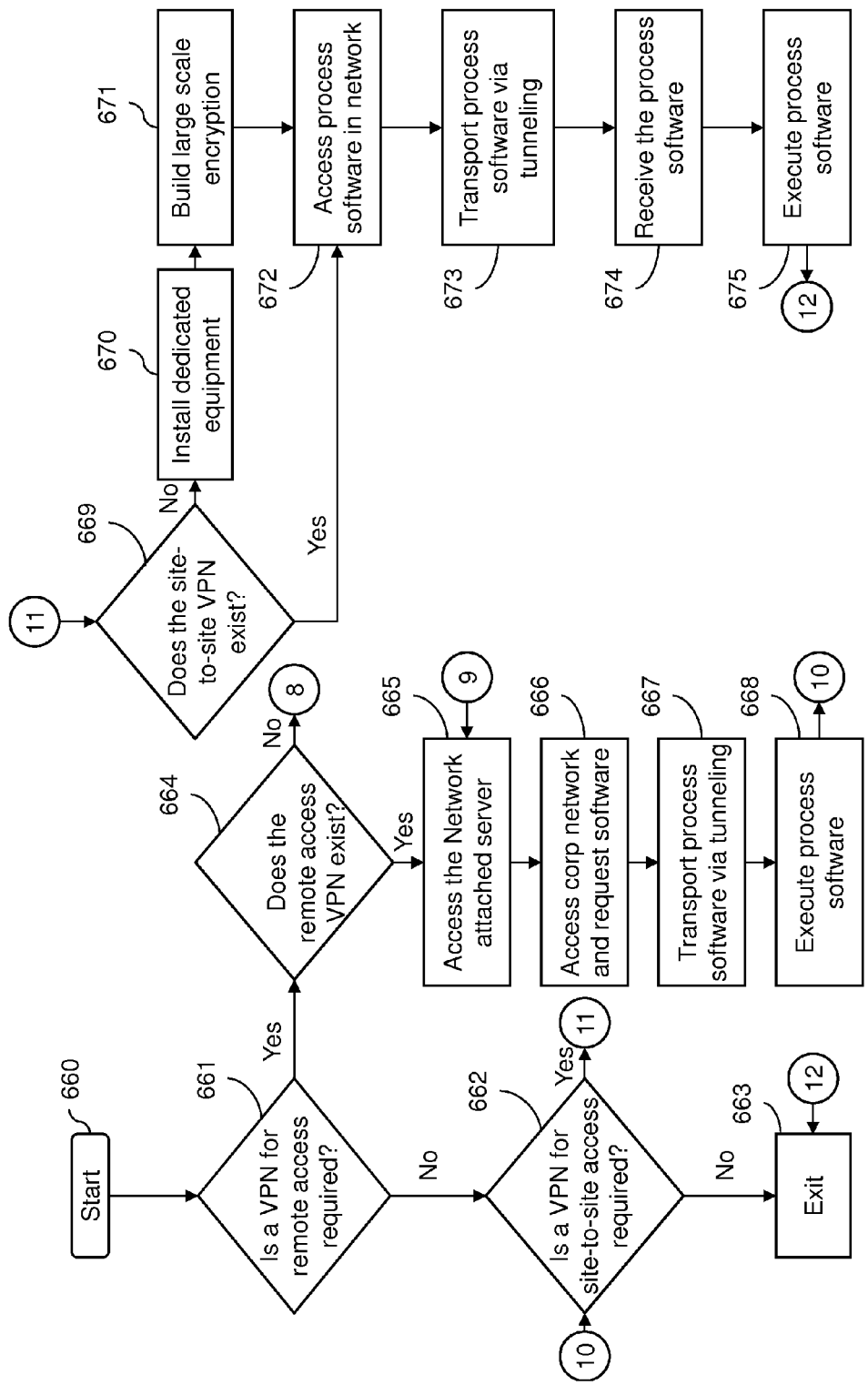
FIG. 8 is a schematic diagram of a virtual private network system according to systems and methods herein.

In FIGS. 8 and 9, step 660 begins the Virtual Private Network (VPN) process. A determination is made to see if a VPN for remote access is required 661. If it is not required, then proceed to 662. If it is required, then determine if the remote access VPN exists 664.

If it does exist, then proceed to 665. Otherwise, identify the third party provider that will provide the secure, encrypted connections between the company's private network and the company's remote users 676 (FIG. 9). The company's remote users are identified 677. The third party provider then sets up a network access server (NAS) 678 that allows the remote users to dial a toll-free number or attach directly via a cable or DSL modem to access, download, and install the desktop client software for the remote-access VPN 679. Then proceed to 665 (FIG. 8).

After the remote access VPN has been built, or if it been previously installed, the remote users can then access the process software by dialing into the NAS or attaching directly via a cable or DSL modem into the NAS 665. This allows entry into the corporate network where the process software is accessed 666. The process software is transported to the remote users' desktop over the network via tunneling 667. That is, the process software is divided into packets and each packet, including the data and protocol, is placed within another packet. When the process software arrives at the remote users' desktop, it is removed from the packets, reconstituted, and executed on the remote users' desktop 668. Then proceed to 662.

A determination is made to see if a VPN for site-to-site access is required 662. If it is not required, then proceed to exit the process 663. Otherwise, determine if the site-to-site VPN exists 669. If it does exist, then proceed to 672. Otherwise, install the dedicated equipment required to establish a site-to-site VPN 670. Then build the large-scale encryption into the VPN 671.

After the site-to-site VPN has been built, or if it had been previously established, the users access the process software via the VPN 672. The process software is transported to the site users over the network via tunneling 673. That is, the process software is divided into packets and each packet, including the data and protocol, is placed within another packet. The process software is received at the remote users' desktop 674. When the process software arrives at the remote users' desktop, it is removed from the packets, reconstituted, and executed on the site users' desktop 675. Proceed to exit the process 663.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

The terminology used herein is for the purpose of describing particular systems and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various systems and methods of the present disclosure have been presented for purposes of illustration, but are not intended to be exhaustive or limited to the systems and methods disclosed. Many modifications and variations will be apparent to those of ordinary skill in the art without departing from the scope and spirit of the described systems and methods. The terminology used herein was chosen to best explain the principles of the systems and methods, the practical application or technical improvement over technologies found in the marketplace, or to enable others of ordinary skill in the art to understand the systems and methods disclosed herein.

What is claimed is:

1. A method comprising:
    precharging a first bitline to a first voltage level, a plurality of dynamic random-access memory (DRAM) cells being operatively connected to an input side of a multiplexer device by said first bitline;
    precharging a second bitline to a second voltage level, a sense device being operatively connected to an output side of said multiplexer device by said second bitline, said sense device having a switch voltage and comprising: a pair of transistors arranged in an inverter configuration; and a read enable transistor operatively connected to said pair of transistors, said read enable transistor being connected to a third voltage level,
    selecting said second voltage level such that reception of a signal voltage of a first type adjusts a voltage of said second bitline in a first direction and reception of signal voltage of a second type adjusts said voltage of said second bitline in a second direction opposite from said first direction, said second voltage centering said signal voltage around said switch voltage, said first voltage level, said second voltage level, and said third voltage level being different voltages; and
    passing, using said multiplexer, said signal voltage from a selected one of said plurality of DRAM cells to said second bitline through said first bitline.

2. The method according to claim 1, said sense device comprising:
    an N-channel field-effect transistor (NFET) connected gate-to-gate and drain-to-drain to a P-channel field-effect transistor (PFET), a source terminal of said NFET being connected to ground and a source terminal of said PFET being connected to said read enable transistor.

3. The method according to claim 1, said multiplexer comprising:
    a complementary metal-oxide-semiconductor (CMOS) multiplexer.

4. The method according to claim 1, further comprising connecting said first bitline to ground using an NFET transistor.

5. The method according to claim 1, further comprising connecting said second bitline to a power supply using a PFET transistor.

6. The method according to claim 5, further comprising boosting a gate of said PFET transistor to a negative voltage.

7. A method, comprising:
    supplying power to a global bitline using a first power supply at a predetermined potential, said global bitline being operatively connected to a sense device, said sense device having a switch voltage;
    sensing a signal voltage from a dynamic random-access memory (DRAM) cell operatively connected to said global bitline using said sense device; and
    controlling said potential of said global bitline by controlling an output voltage of said first power supply such that reception of said signal voltage of a first type adjusts said potential of said global bitline in a first direction and reception of said signal voltage of a second type adjusts said potential of said global bitline in a second direction opposite from said first direction, centering said signal voltage around said switch voltage.

8. The method according to claim 7, said signal voltage indicating a state of said DRAM cell.

9. The method according to claim 8, said state of said DRAM cell being one of a high signal and a low signal, said method further comprising centering a band of said high signal and said low signal around said switch voltage of said sense device.

10. The method according to claim 7, said supplying power to said global bitline further comprising boosting said first power supply to a negative voltage.

11. The method according to claim 7, further comprising supplying power to said sense device using a second power supply at a predetermined potential, an output voltage of said second power supply being different than said output voltage of said first power supply.

12. The method according to claim 11, said sense device comprising:
    an N-channel field-effect transistor (NFET) connected gate-to-gate and drain-to-drain to a P-channel field-effect transistor (PFET), a source terminal of said NFET being connected to ground and a source terminal of said PFET being connected to said second power supply.

13. The method according to claim 7, further comprising:
    connecting said DRAM cell to said global bitline using a local bitline, said local bitline being operatively connected to said DRAM cell and a multiplexer device, said multiplexer device being operatively connected to said global bitline, and said local bitline being precharged to ground.

14. A semiconductor device, comprising:
    a plurality of dynamic random-access memory (DRAM) cells;
    a complementary metal-oxide-semiconductor (CMOS) multiplexer operatively connected to said plurality of DRAM cells through a first bitline;
    a first transistor operatively connecting said first bitline to a first voltage;

a second bitline operatively connected to said CMOS multiplexer;
a second transistor operatively connecting said second bitline to a second voltage; and
a sense device operatively connected to said second bitline, said sense device comprising:
   a CMOS inverter having a switch voltage; and
   a third transistor operatively connecting said CMOS inverter to a third voltage, said CMOS multiplexer passing a signal voltage from a selected one of said plurality of DRAM cells through a first bitline to said second bitline,
said second voltage being selected such that reception of said signal voltage of a first type adjusts a voltage of said second bitline in a first direction and reception of said signal voltage of a second type adjusts said voltage of said second bitline in a second direction opposite from said first direction, centering said signal voltage around said switch voltage, and
said first voltage, said second voltage, and said third voltage being different voltages.

15. The semiconductor device according to claim 14, said sense device comprising:
   an N-channel field-effect transistor (NFET) connected gate-to-gate and drain-to-drain to a P-channel field-effect transistor (PFET), a source terminal of said NFET being connected to ground and a source terminal of said PFET being connected to said third transistor; and
   said third transistor comprising a PFET.

16. The semiconductor device according to claim 14, said first transistor comprising an NFET connecting said first bitline to ground.

17. The semiconductor device according to claim 14, said second transistor comprising a PFET connecting said second bitline to a power supply.

18. The semiconductor device according to claim 17, a gate of said PFET being boosted to a negative voltage.

19. The semiconductor device according to claim 14, said signal voltage indicating a state of said selected one of said plurality of DRAM cells.

20. The semiconductor device according to claim 14, said plurality of DRAM cells comprising embedded DRAM.

\* \* \* \* \*